United States Patent
Arkhipov et al.

(10) Patent No.: US 7,659,628 B2
(45) Date of Patent: Feb. 9, 2010

(54) CONTACT STRUCTURE COMPRISING SEMICONDUCTOR AND METAL ISLANDS

(75) Inventors: Vladimir Arkhipov, Leuven (BE); Paul Heremans, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 11/186,301

(22) Filed: Jul. 20, 2005

(65) Prior Publication Data

US 2006/0033208 A1 Feb. 16, 2006

Related U.S. Application Data

(60) Provisional application No. 60/601,192, filed on Aug. 13, 2004.

(51) Int. Cl.
*H01L 23/48* (2006.01)

(52) U.S. Cl. .............. 257/758; 257/288; 257/E29.143; 257/E21.046; 257/E21.062

(58) Field of Classification Search ............. 257/734, 257/759, 758, 288, E29.143, E21.046, E21.062
See application file for complete search history.

(56) References Cited

U.S. PATENT DOCUMENTS

| | | | | | |
|---|---|---|---|---|---|
| 4,663,559 | A | * | 5/1987 | Christensen | 313/336 |
| 5,652,054 | A | * | 7/1997 | Kikitsu et al. | 428/328 |
| 6,023,128 | A | | 2/2000 | Grothe et al. | |
| 6,274,933 | B1 | * | 8/2001 | Abdelgadir et al. | 257/758 |
| 6,495,442 | B1 | * | 12/2002 | Lin et al. | 438/618 |
| 2002/0114949 | A1 | * | 8/2002 | Bower et al. | 428/401 |
| 2002/0160522 | A1 | * | 10/2002 | Rubinstein et al. | 436/164 |
| 2003/0092214 | A1 | | 5/2003 | Klauk et al. | |
| 2003/0146446 | A1 | | 8/2003 | Yamazaki et al. | |
| 2004/0067602 | A1 | * | 4/2004 | Jin | 438/22 |
| 2004/0071951 | A1 | * | 4/2004 | Jin | 428/323 |
| 2004/0197550 | A1 | * | 10/2004 | Ke et al. | 428/327 |
| 2005/0202615 | A1 | * | 9/2005 | Duan et al. | 438/197 |

FOREIGN PATENT DOCUMENTS

JP 08222375 A 8/1996

OTHER PUBLICATIONS

Jo et al., "Gate tunable electron injection in submicron pentacene transistors", Nanotechnology 15 (2004) pp. 1023-1026, Institute of Physics Publishing (Jun. 21, 2004).
Extended European Search Report, Dated Nov. 7, 2007, in Application No. 05447181.8.
J. Jo et al., "Gate tunable electron injection in submicron pentacene transistors," Nanotechology 15 (2004) 1023-1026.

* cited by examiner

*Primary Examiner*—Bradley K Smith
*Assistant Examiner*—Mohammad T Karimy
(74) *Attorney, Agent, or Firm*—McDonnell Boehnen Hulbert & Berghoff LLP

(57) ABSTRACT

Contact structures and methods for forming such contact structures are disclosed. An example contact structure includes a layer of semiconductor material having an interface and an electrical contact at the interface of the layer of semiconductor material, where the electrical contact includes a granular metal. An example method for forming a contact structure includes providing a substrate and producing a granular metal on at least part of the substrate, where the granular metal includes a cluster of metal islands extending essentially in a two-dimensional plane. The method further includes depositing a layer of a semiconductor material on top of the substrate and the cluster of metal islands.

10 Claims, 6 Drawing Sheets

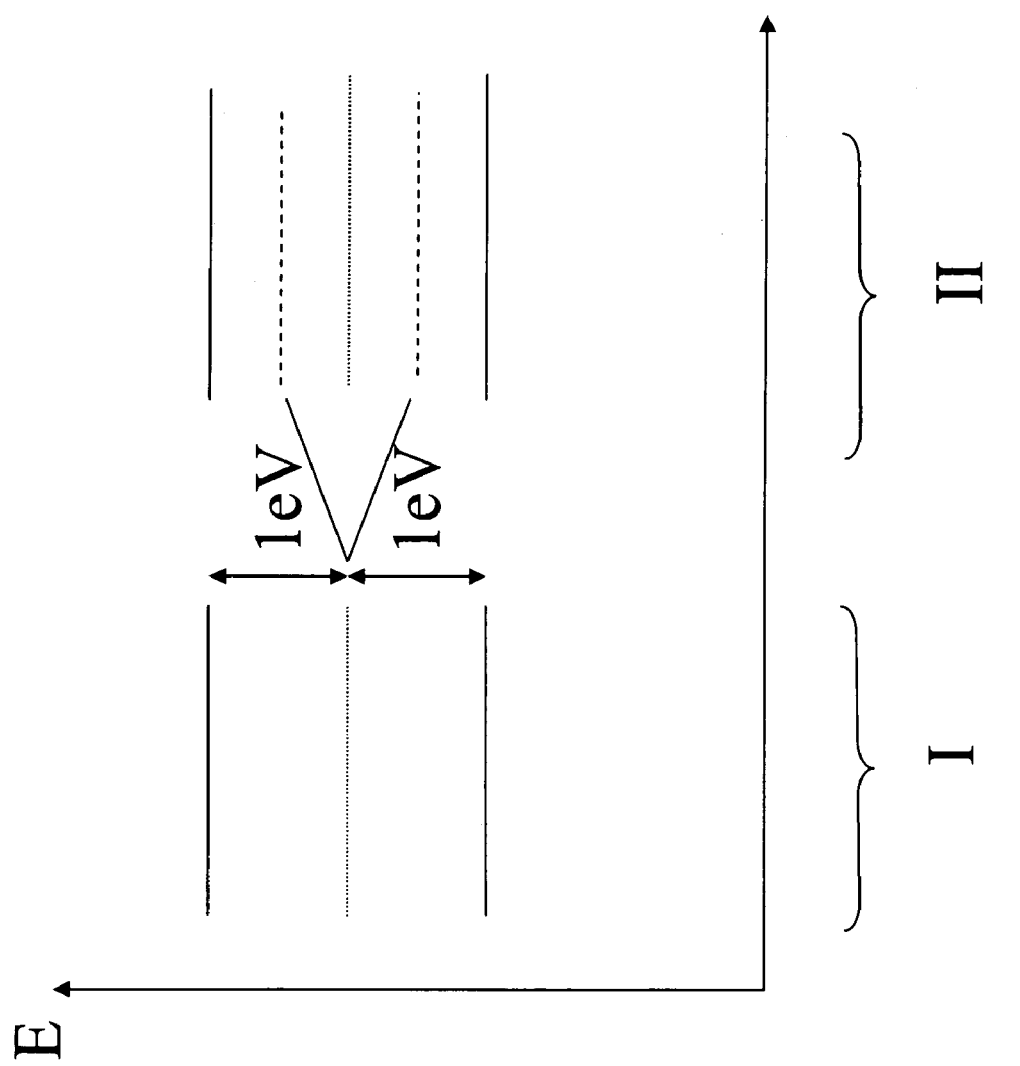

CONTACT STRUCTURE COMPRISING SEMICONDUCTOR AND METAL ISLANDS

CROSS REFERENCE TO RELATED APPLICATIONS

This application claims benefit under 35 U.S.C. § 119 to U.S. Provisional Patent Application 60/601,192, filed Aug. 13, 2004 and of the same title as the present application. The entire disclosure of U.S. Provisional Patent Application 60/601,192 is incorporated herein by reference.

BACKGROUND

I. Field

This disclosure relates to the field of microelectronics. More particularly, this disclosure relates to contacting structures for semiconductor materials and methods for fabrication of such structures.

II. Description of Related Art

Efficient and balanced injection of both electrons and holes is desirable in the operation of bipolar devices and/or electronic devices where complementary charge carriers are required, such as light-emitting diodes and complementary (e.g., n-type and p-type) transistors. In certain organic devices (e.g., organic light-emitting diodes (OLEDs)) this objective is achieved through the use of different materials for forming electrical contacts. In such approaches, a first material may be used to form an anode of the organic device while a second material may be used to form a cathode of the organic device.

However, the use of different contact metals in OLEDs does not consistently provide for efficient charge injection into wide bandgap organic materials (e.g., materials with a bandgap>3 eV). Such materials may be used, for instance, in blue light emitters. In order to achieve efficient electron injection with such wide bandgap materials, low work-function metals are used to promote efficient electron injection. Such approaches have certain drawbacks, however. For instance, such low work-function materials are highly reactive, which makes them difficult to process. Typically, such materials are processed in a vacuum. A further drawback is that such low work-function materials must be encapsulated in order to prevent degradation after removal from a vacuum environment in which they are processed (e.g., deposited, patterned, etc.).

In other devices, such as organic light-emitting thin-film transistors (OLETFTs), electrons and holes are injected into the transistor channels simultaneously during operation. The ohmic contacts for such OLETFTs are usually deposited using a shadow mask. Deposition of two different contact materials (e.g., different metals) requires, for the deposition of the second material, positioning the corresponding shadow mask, which may be the same mask used for the first material or a second mask, with greater precision than the channel length of the OLETFTs. Such precise positioning is an extremely difficult task for devices with channel lengths of a few micrometers or smaller. Thus, such processes may experience significant yield loss due to alignment issues associated with such an approach. Such yield loss would result in a corresponding increase in the cost of producing such devices.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are given by way of example and meant to be illustrative, not limiting in scope. In various embodiments, one or more of the above-described problems have been reduced or eliminated, while other embodiments are directed to other improvements.

Contact structures for use in electronic devices and methods for producing such contact structures are disclosed. The contact structures disclosed herein may be implemented in electronic devices in which complementary charge carriers are required for the devices to function properly. Examples of such devices are organic transistors, organic solar cells, organic LEDs, and organic photo detectors. The contact structures described herein improve the efficiency of carrier injection for both electrons and holes by reducing the injection barrier for charge carriers into semiconductor materials.

An example contact structure includes a layer of semiconductor material having an interface and an electrical contact at the interface of the layer of semiconductor material, where the electrical contact includes a granular metal. In this context, a granular metal may be defined as a plurality of metal islands of varying or substantially similar size, where the metal islands are embedded in a semiconductor material and/ or an insulator.

An example method for forming such a contact structure includes providing a substrate and producing a granular metal on at least part of the substrate, where the granular metal includes a cluster of metal islands extending essentially in a two-dimensional plane. The method further includes depositing a layer of a semiconductor material on top of the substrate and the cluster of metal islands.

BRIEF DESCRIPTION OF THE DRAWINGS

Example embodiments are illustrated in referenced figures of the drawings. It is intended that the embodiments and figures disclosed herein are to be considered illustrative rather than restrictive.

FIG. 6 is a bandgap diagram that illustrates the reduction of injection barriers for electrons and holes when using island metal contacts (shown in section II), as compared to ordinary bulk metal contacts (shown in section I).

DETAILED DESCRIPTION

Overview

Figure 1:
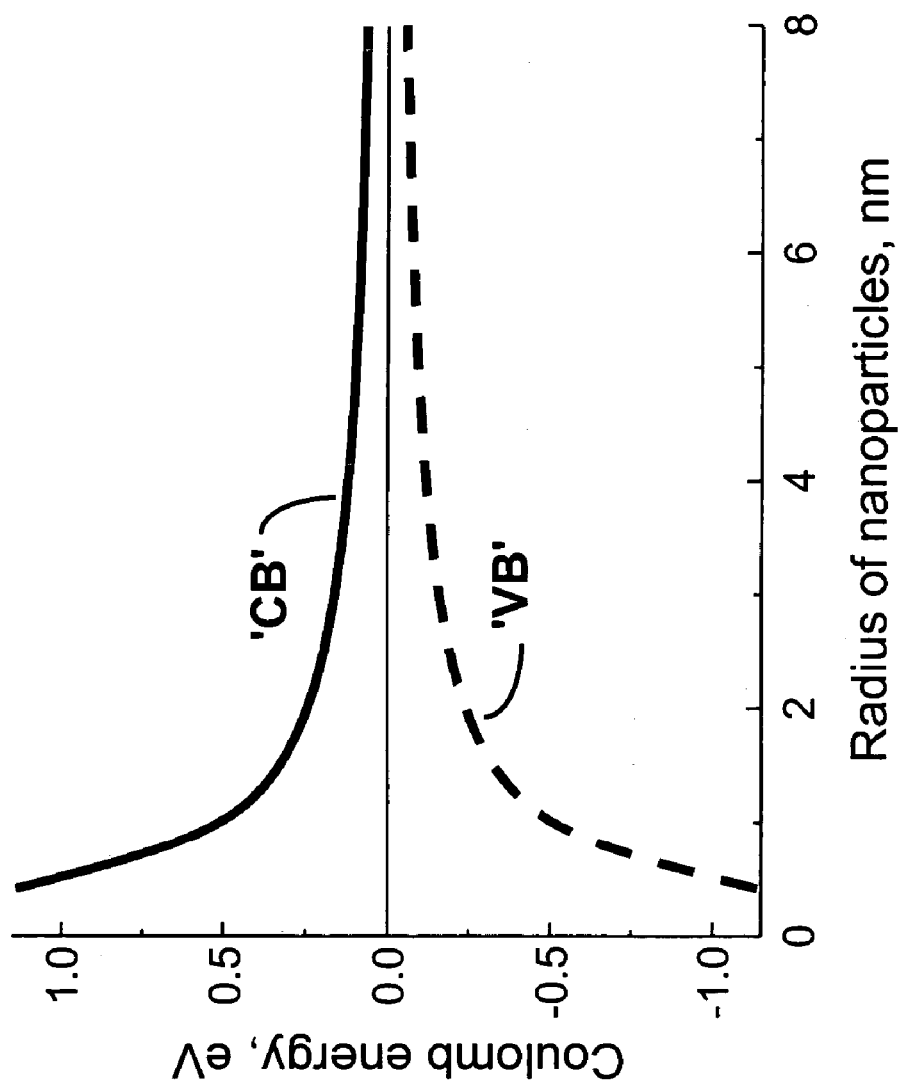
FIG. 1 is a graph that illustrates the electrostatic energies of an electron (CB) and a hole (VB) occupying metal nanoparticles as a function of the nanoparticles radius.

In order to overcome at least some of the drawbacks discussed above for electronic devices, such as, for example, complementary thin-film transistors (TFTs) using organic semiconductor materials or organic light-emitting thin-film transistors (OLETFTs), one potential solution would be to use a single contact deposition process to form the ohmic contacts (e.g., using the same contact material or materials) for both p-type and n-type semiconductor materials. Such an approach would be more cost effective than processes using two different contact materials as such an approach would reduce the number of masks steps required from, for example, two mask steps to a single mask step. Accordingly, such an approach would also reduce yield loss that results from the alignment precision issues described above. Furthermore, elimination of such alignment concerns would allow for the design and fabrication of devices with smaller critical geometries, such as channel lengths. Such design freedom would result in the ability to produce devices with improved performance.

However, if a bulk metal is used to form contacts for both p-type and n-type organic semiconductor layers, it is desirable that the Fermi level of the bulk metal be substantially in the middle of the energy gap separating a highest occupied molecular orbit and a lowest unoccupied molecular orbit (HOMO and LUMO, respectively) of the semiconductor material in order to have equally efficient injection of both electrons and holes. For semiconductor materials with bandgaps of 3 eV or higher (wideband gap materials), this implies that the hole and electron injection barriers are 1.5 eV or greater (e.g., half the bandgap of the semiconductor material). Such injection barriers make both hole injection and electron injection very difficult.

The contact structures, and associated methods for forming such structures, described herein address at least some problems of current approaches that are described above, as well as the injection barrier concerns of using a single metal for contacting both n-type and p-type transistors and/or bipolar devices, for example. Briefly, the contact structures described herein include island metals, which may also be termed "granular metals." Such island metals are used as "bipolar" contacts (e.g., for the injection of holes and electrons). Such contact structures function based on the principle that small (e.g., nano-size) metal grains or particles have small capacitances. Accordingly, such nano-size metal particles may gain a high electrostatic energy as a result of being charged with only a single elementary charge. For example, a substantially spherical metal grain with a 1 nm radius that is embedded in an insulator with a dielectric constant of 3 acquires an electrostatic energy of approximately 1 eV.

Furthermore, for devices including organic semiconductor materials (as well as other materials), such contact structures do not present device performance concerns due to the conductivity of such structures as the conductivity of such structures is equal to or greater than the conductivity of organic semiconductor materials. The fact that the conductivity of such island metal contact structures is equal to or higher that that of, for example, organic semiconductor materials is due, in part, to the fact that such structures conduct current via carrier hopping between metal grains.

Electrostatic Energy of Nano-size Metal Grains

FIG. 1 is a graph that illustrates the electrostatic energy of metal particles formed of the same material(s) that are charged with an elemental charge. In FIG. 1, electrostatic energy is shown as a function of the radius of the particles. The line designated 'CB' indicates electron charged metal particles, while the line designated 'VB' indicates hole charged metal particles. As shown in FIG. 1, electron and hole charged nano-size metal particles (metal nanoparticles) exhibit increased electrostatic energy as the radius of such particles decreases. Therefore, an island metal contact structure that includes a sequence or arrangement of metal nanoparticles with gradually decreasing sizes provides conditions for a gradual increase in the energy gap separating positively and negatively charged metal nano-particles. It will be appreciated, based on the relationship illustrated in FIG. 1, that a structure including metal nanoparticles of varying sizes may be used as an efficient charge carrier injection contact for both electrons and holes.

Method for Producing Island Metal Contact Structure

Figure 2:
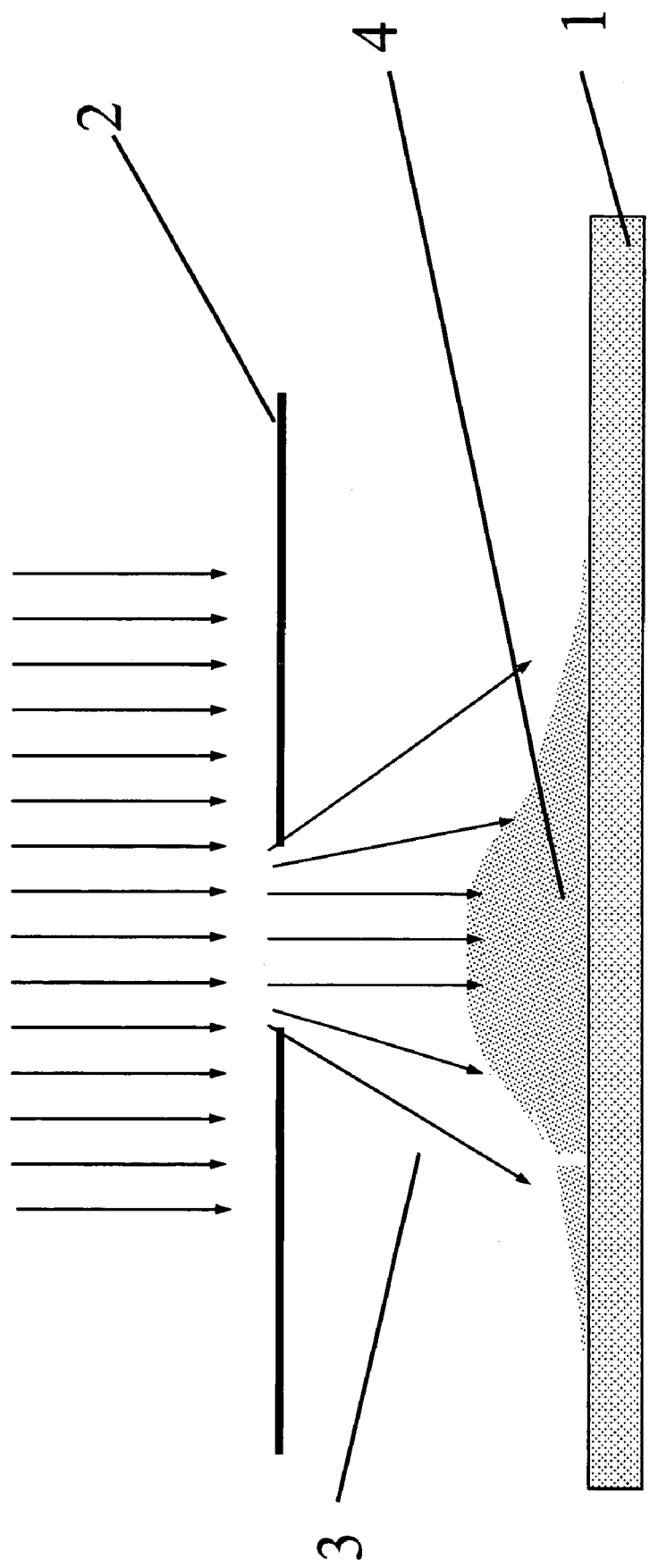
FIG. 2 is a schematic drawing illustrating the deposition of a coplanar contact using a shadow mask.

FIG. 2 is a schematic drawing illustrating the deposition of a coplanar metal contact that may be used to form an island metal contact structure. As shown in FIG. 2, a substrate 1 is provided on which the contact is formed. A shadow mask 2, which includes a hole, is positioned above the substrate 1. The shadow mask 2 is used to define the area on the substrate 1 on which a metal film 4 (coplanar metal contact) is formed. To form the metal film 4, a metal deposition flux impinges on the shadow mask 2. The hole in the shadow mask 2 allows a portion of the metal flux to impinge on the substrate 1 as a non-constant metal flux 3. The non-constant metal flux 3 forms the metal film 4, where the metal film 4 gradually decreases in thickness from its center into the "shadow" region (e.g., the area of the substrate 1 at or beyond the perimeter of the hole in the shadow mask 2). Additionally, the non-constant flux 3 results in the edges of the metal film 4 (the coplanar contact) having graded, rather than sharp edges. Of course, other deposition techniques may be used to provide a metal flux that varies (e.g., continuously or randomly) over a substrate or a portion of a substrate, to produce a metal film with varying thickness.

The substrate 1 and metal film 4 shown in FIG. 2 are then subjected to a heat treatment to form island metals from the metal film 4. Depending on the particular embodiment, it may be advantageous to have the temperature during this heat treatment be higher than the melting point of the metal used to form the metal film 4. The formation of island metals from the metal film 4 may occur as a result of an evaporation process. Alternatively, the island metals may be formed using the combination of an evaporation process and a heating process.

Figure 3:
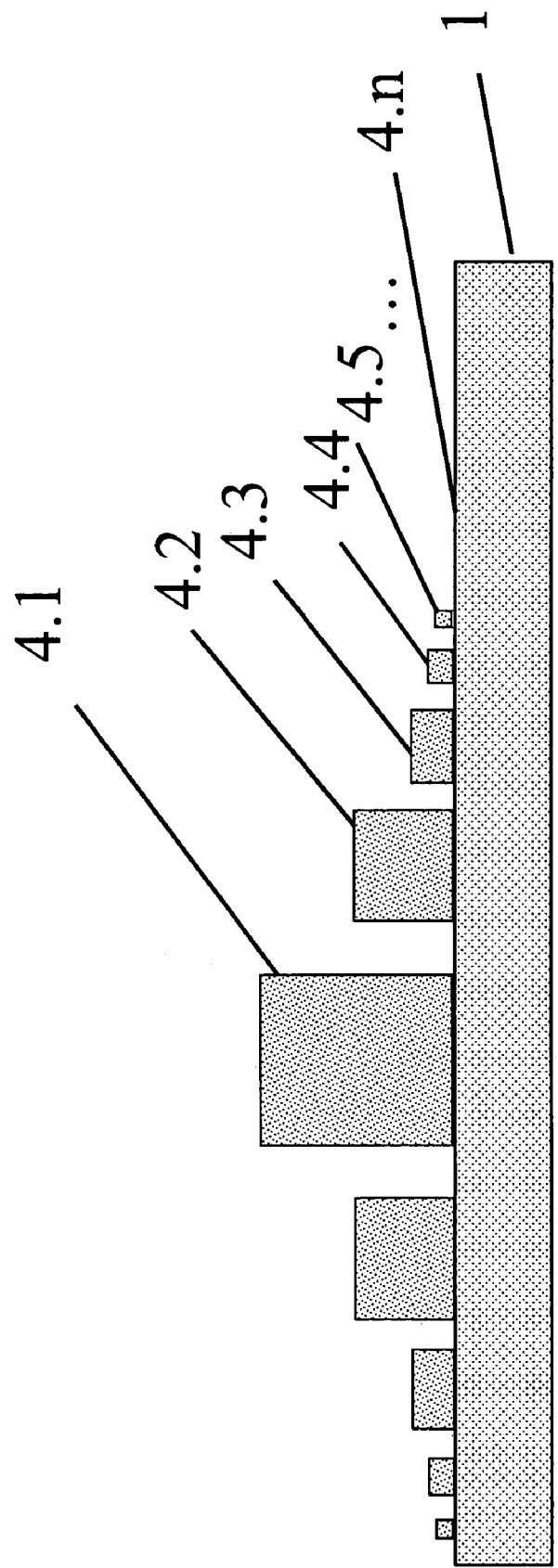
FIG. 3 is a schematic drawing that illustrates the coplanar contact of FIG. 2 after heat treatment, where the continuous metal film is converted into metal islands.
Figure 4:
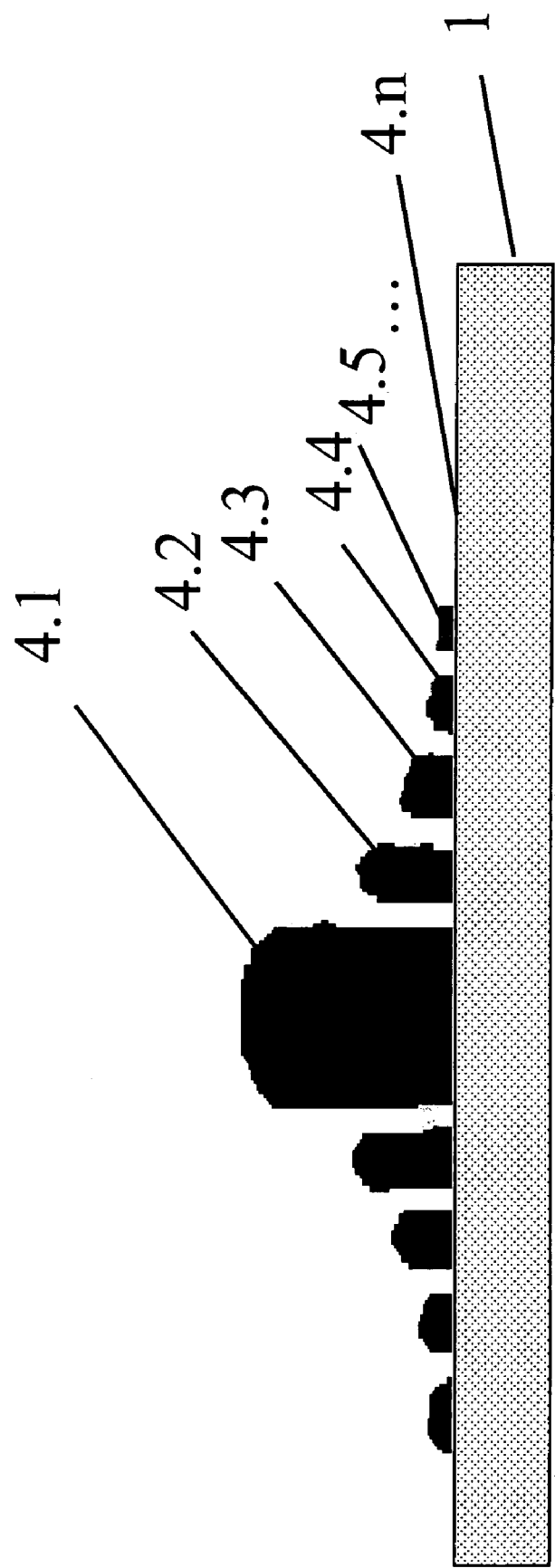
FIG. 4 is a cross-sectional drawing that more accurately depicts the form of the metal islands illustrated in FIG. 3 in an electronic device.

Due to the gain of surface energy during the heat treatment, the continuous metal film 4 splits into a number of metal islands whose sizes gradually decrease (in a similar thickness profile as the metal film 4) toward the edge of the bulk metal film 4. The results of such a process being performed on the metal film 4 are shown schematically in FIG. 3 and in a more empirical cross-section in FIG. 4. As is shown in FIGS. 3 and 4, the continuous metal film 4 is converted into metal islands (4.1, 4.2, 4.3 . . . 4.n) with sizes that decrease toward the contact area edges. Generally, there is a correlation between the initial metal thickness and the final island sizes. For the embodiment illustrated in FIGS. 3 and 4, the metal islands 4.1, 4.2, 4.3 . . . 4.n gradually decrease in size in essentially a two-dimensional plane on the substrate 1 in a direction parallel to the substrate 1 (e.g., radially from the center of metal film 4).

Different parameters may be varied to control the dimensions of the metal film 4 and the resulting island metal contact area. These parameters include the shape of the hole(s) in the shadow mask 2, the deposition conditions of the metal film 4, the material selected for the substrate 1, the material selected for the metal film 4, the materials that are selected for any layer or films that subsequently applied to the contact structures 4.1, 4.2, 4.3 . . . 4.n, such as polymer and/or organic semiconductor materials, among any number of other parameters or factors.

In empirical experiments, aluminum and gold island metal films were prepared by evaporation in an Ultra High Vacuum (UHV). The pressure during the evaporation was kept at 1e-8 Torr. For the aluminum evaporation, the aluminum cell was held at a constant temperature of 1150° C. For the gold evaporation, the gold cell was held at a constant temperature of 1450° C. Both conditions resulted in evaporation rates of approximately 10 nm per minute. Also, before the respective evaporation operations, the respective substrates were cooled using a cryotank filled with liquid nitrogen. The evaporation time was 1 second, which produced a thickness of around 0.17 nm. Electrical probing of the resulting structures showed substantially zero current was conducted in the contact area. These results indicate that formation of non-continuous metal island structures occurred as a result of the heat treatment. It will be appreciated that such a process will produce substantially homogenous metal island structures with essentially similar metal island size on a nanometer scale. While the materials used for the metal island contact structures in these experiments were gold and aluminum, other possible contact materials may be used. These materials include, for example, Ag, Pt or Pd.

As shown in FIGS. 3 and 4, the metal islands 4.1, 4.2, 4.3 . . . 4.n have essentially continuously varying sizes. For example, the metal islands 4.1, 4.2, 4.3 . . . 4.n may vary in size with islands as small as, for example, 0.25 nm in radius and varying up to approximately 10 nm in radius, or larger. As such metal islands are generally irregular in shape (though they may also be regularly shaped, such as spherically shaped), metal island dimensions as discussed herein generally indicate a largest radially dimension of a given metal island (e.g., metal nanoparticle).

It will be appreciated that large metal islands (e.g., larger than 10 nm or larger than 40 nm in radius) have electrical behavior that is substantially equivalent to a continuous film. Such large metal islands, in combination with varying smaller metal islands, allows for a broader spectrum of the various electrostatic energies illustrated FIG. 1 to be present in such a contact structure. In certain embodiments the size of the islands gradually decreases in a direction parallel to the substrate 1 from an essentially continuous film to islands with a size of about 1 nm in radius. It will be appreciated, however, that the islands 4.1, 4.2, 4.3 . . . 4.n in other embodiments may be of essentially the same size or may be of other varying sizes.

For island metals, such as the island metals 4.1, 4.2, 4.3 . . . 4.n, distances between an individual metal island and its nearest neighbor metal island may be referred to as inter-island distances. Depending on the particular embodiment, the inter-island distances may vary between 0.3 nm and 3 nm. Furthermore, the inter-island distance may be substantially constant or can vary. For example, the inter-island distance may vary around an average, or median distance of 1 nm.

Figure 5:
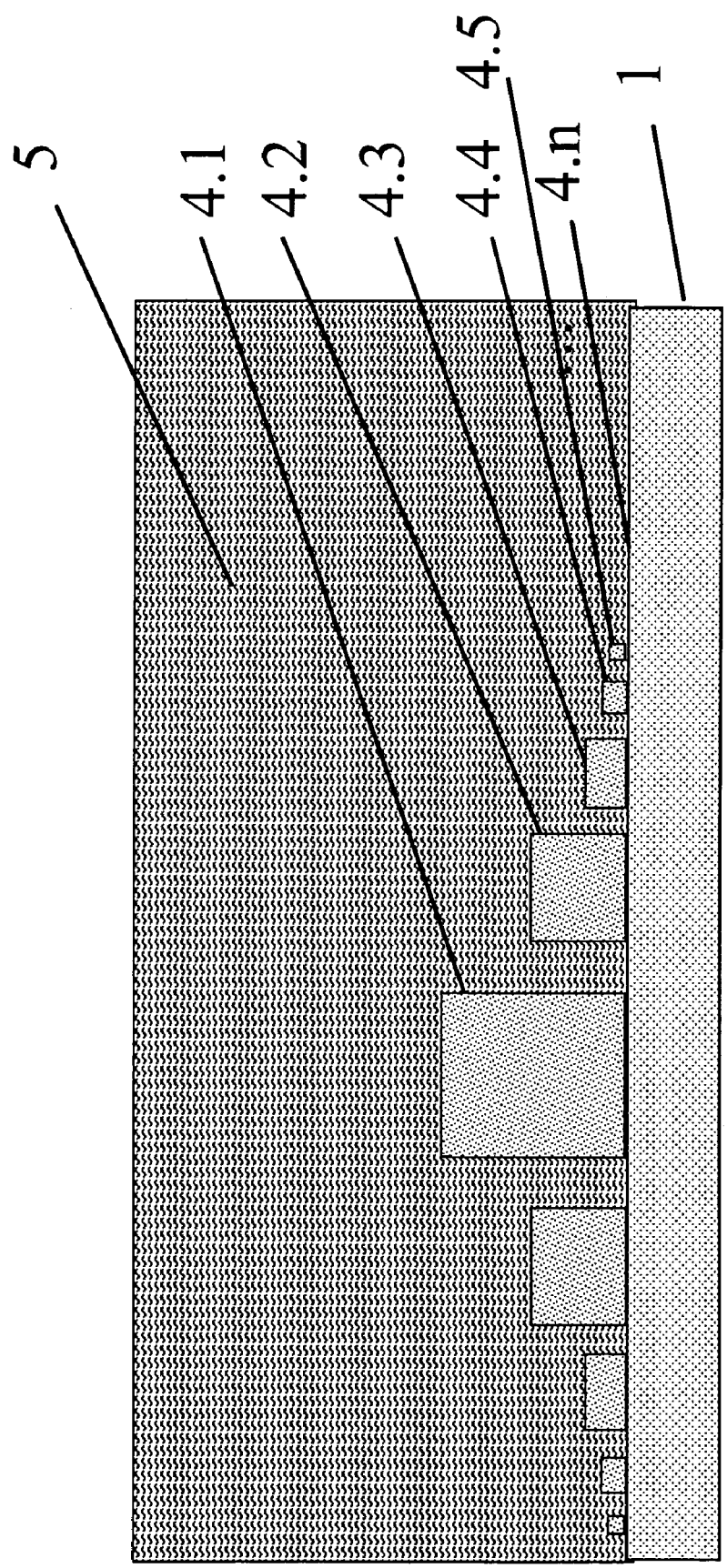
FIG. 5 is a cross-sectional drawing that illustrates the metal islands of FIGS. 3 and 4 after deposition of a semiconductor material to create a contact structures at the interface of the semiconductor material.

FIG. 5 illustrates the structure of FIGS. 3 and 4 after deposition of a semiconductor material 5. For electronic devices, such as those discussed above, the semiconductor materials may be an intrinsic wide-band semiconductor material. Such materials typically have bandgaps of 1.8 eV or larger. Further, the semiconductor material 5 may be an organic or polymer material. Examples of such materials are provided in Table 1 below. When using such organic or polymer materials, it may be advantageous for the substrate 1 to be a flexible substrate.

TABLE 1

| Material | Band gap, eV |
| --- | --- |
| Anthracene | 3.9 |
| Tetracene | 3.1 |
| Perylene | 2.9 |
| Aluminum tris(8-hydroxyquinoline), | 3.3 |
| 4,4'-N,N'-dicarbazol-biphenyl | 3.1 |
| Poly(p-phenylenevinylene) | 3.1 |
| Poly(9,9'-dioctylfluorene) | 3.2 |

The deposition of the semiconductor material 5, in conjunction with the metal islands 4.1, 4.2, 4.3 . . . 4.n produces what may be termed a "granular metal." For purposes of this disclosure, a granular metal comprises metal nanoparticles surrounded by an insulator and/or a semiconductor material matrix. For embodiments that include a semiconductor matrix, this matrix may be regular or non-regular.

In an alternative embodiment, a semiconductor material layer (e.g., using an organic or polymer semiconductor material) may be deposited on the substrate 1. A granular metal may then be formed on at least a portion of the semiconductor layer, where the granular metal includes metal islands of varying size that extend essentially in a 2 dimensional plane on the semiconductor layer to create a contact area.

In other embodiments, the process of depositing the semiconductor material and the step of producing a granular metal are performed at the same time. For instance, in such embodiments, the deposited semiconductor material fills the gaps between the metal islands and thus creates a granular metal.

In still other embodiments, a passivation layer may be deposited on top of a cluster of metal islands. Such a passivation layer may be deposited to prevent, for example, oxidation of the metal islands.

Charge Carrier Injection

For a structure such as the structure illustrated in FIG. 5, if a metal island in that structure is formed with a metal nanoparticle having a radius 'r' is occupied by a charge carrier (either an electron or a hole), the electrostatic energy 'E' of that metal nanoparticle when embedded in an insulator or semiconductor material with a dielectric constant 'ε' is given by the formula:

$$E = \frac{e^2}{4\pi\varepsilon_0\varepsilon r}$$

where e is the elementary charge (of the electron or the hole) and $\varepsilon_0$ is the permittivity of a vacuum.

Transfer of a single elementary charge between a pair of originally neutral metal nanoparticles creates a pair of positive and negative charges. This process requires an energy of 2E. Thus, such granular metal structures exhibit semiconductor properties and the energy W=2E can be considered as the bandgap width of the structure. For a structure with ε=3 and a metal nanoparticle with a radius r=1 nm, the bandgap of such a structure may be as large as 0.96 eV. Injection from such a granular metal contact into a semiconductor material would result in both the electron and hole injection barriers to be reduced by half the bandgap of the granular metal, e.g., by 0.48 eV in the above example.

As shown in FIG. 6, for injection by such a contact structure into a semiconductor material with a bandgap of 2 eV, the injection barriers for electrons and holes are reduced from 1 eV (for injection from a bulk metal with a Fermi level at mid-gap (1 eV) of the semiconductor material) to a mere 0.52 eV. Such charge transport characteristics in granular metals are due, in part, to carrier hopping or carrier transport between metal grains.

Conclusion

While a number of aspects and embodiments have been discussed above, it will be appreciated that various modifications, permutations, additions and/or sub-combinations of these aspects and embodiments are possible. It is therefore intended that the following appended claims and claims hereafter introduced are interpreted to include all such modifications, permutations, additions and/or sub-combinations as are within their true spirit and scope.

We claim:

1. An electronic device that includes at least:
   a semiconductor layer; and
   an electrical contact structure in contact with a contact surface of the semiconductor layer such that charge carriers can be injected across the contract surface;
   wherein the electrical contact structure includes a plurality of metal grains arranged in an essentially two-dimensional plane along the contact surface;
   wherein at least a plurality of the metal grains are non-continuous, and wherein at least a plurality of the non-continuous metal grains are sufficiently closely spaced such that the electrical contact structure transfers charges laterally by carrier hopping between metal grains;
   wherein the semiconductor layer has a highest occupied molecular orbit energy level and a lowest unoccupied molecular orbit energy level;
   wherein the metal grains are made of a metal that has a Fermi energy level between the highest occupied molecular orbit energy level and the lowest unoccupied molecular orbit energy level;
   wherein there is a first energy gap between the Fermi energy level and the highest occupied molecular orbit energy level;
   wherein there is a second energy gap between the Fermi energy level and the lowest unoccupied molecular orbit energy level; and
   wherein, for at least a plurality of the metal grains, each respective metal grain in the plurality has a capacitance value small enough that a unit charge on the respective metal grain has an electrostatic energy of at least about half of the first or second energy gap.

2. An electronic device according to claim 1, wherein the conductivity of the electrical contact structure is at least as great as the conductivity of the semiconductor layer.

3. An electronic device according to claim 2, wherein the electrical contact structure includes an insulator material between the non-continuous metal grains.

4. An electronic device according to claim 1, wherein the semiconductor layer has a bandgap of at least about 1.8eV.

5. An electronic device according to claim 1, wherein at least a plurality of the metal grains are in contact with the contact surface of the semiconductor layer.

6. An electronic device according to claim 1, wherein, for at least a plurality of the metal grains, the respective metal grain has a capacitance value small enough that a unit charge on the respective metal grain has an electrostatic energy of at least about 0.48eV.

7. An electronic device according to claim 1, wherein the semiconductor layer has a bandgap of at least about 3eV.

8. An electronic device according to claim 1, wherein the metal grains have a plurality of different respective radii, and wherein the values of those radii substantially span at least the range of about 1 nm to about 10 nm.

9. An electronic device according to claim 1 wherein the electrical contact structure has a center portion and an outer edge, and wherein the size of the metal islands substantially gradually decreases from the center portion of the contact structure to the outer edge of the contact structure, in a direction substantially parallel to the contact surface.

10. An electronic device according claim 1, wherein each non-continuous metal grain has a nearest neighbor, and wherein substantially all non-continuous metal grains have a distance of between about 0.3 nm and about 3 nm from their respective nearest neighbor.

* * * * *